(12) United States Patent
Wang et al.

(10) Patent No.: US 7,834,365 B2
(45) Date of Patent: Nov. 16, 2010

(54) LED CHIP PACKAGE STRUCTURE WITH HIGH-EFFICIENCY LIGHT-EMITTING EFFECT AND METHOD OF PACKING THE SAME

(75) Inventors: Bily Wang, Hsinchu (TW); Jonnie Chuang, Banciao (TW); Wen-Kuei Wu, Hukou Township, Hsinchu County (TW)

(73) Assignee: Harvatek Corporation, Hsinchu (TW)

( * ) Notice: Subject to any disclaimer, the term of this patent is extended or adjusted under 35 U.S.C. 154(b) by 392 days.

(21) Appl. No.: 11/898,378

(22) Filed: Sep. 12, 2007

(65) Prior Publication Data

US 2009/0065789 A1 Mar. 12, 2009

(51) Int. Cl.
*H01L 29/18* (2006.01)
(52) U.S. Cl. .............................. 257/88; 257/98; 257/99; 257/E33.061
(58) Field of Classification Search .................... 257/88, 257/89, 90, 99, E33.061, 98
See application file for complete search history.

(56) References Cited

U.S. PATENT DOCUMENTS

| 6,921,926 | B2* | 7/2005 | Hsu | 257/98 |
| 2004/0061433 | A1* | 4/2004 | Izuno et al. | 313/498 |
| 2006/0138436 | A1* | 6/2006 | Chen et al. | 257/98 |
| 2006/0157724 | A1* | 7/2006 | Fujita | 257/99 |

* cited by examiner

*Primary Examiner*—Michael Trinh
(74) *Attorney, Agent, or Firm*—Rosenberg, Klein & Lee (57) ABSTRACT

An LED chip package structure with high-efficiency light-emitting effect includes a substrate unit, a light-emitting unit, and a package colloid unit. The substrate unit has a substrate body, and a positive electrode trace and a negative electrode trace respectively formed on the substrate body. The light-emitting unit has a plurality of LED chips arranged on the substrate body. Each LED chip has a positive electrode side and a negative electrode side respectively and electrically connected with the positive electrode trace and the negative electrode trace of the substrate unit. The package colloid unit has a plurality of package colloids respectively covered on the LED chips. Each package colloid has a colloid cambered surface and a colloid light-emitting surface respectively formed on a top surface and a front surface thereof.

11 Claims, 15 Drawing Sheets

FIG. 1
PRIOR ART providing a substrate unit, the substrate unit having a substrate body, and a positive electrode trace and a negative electrode trace respectively formed on the substrate body —S100 arranging a plurality of LED chips on the substrate body via a matrix method to form a plurality of longitudinal LED chip rows, each LED chip having a positive electrode side and a negative electrode side respectively and electrically connected with the positive electrode trace and the negative electrode trace of the substrate unit —S102 longitudinally and respectively covering a plurality of stripped package colloids on the longitudinal LED chip rows via a first mold unit, each stripped package colloid having a plurality of colloid cambered surfaces that form on a top surface thereof and correspond to the LED chips, and each stripped package colloid having a plurality colloid lateral surfaces respectively formed in front of the corresponding colloid cambered surfaces —S104 transversely cutting the stripped package colloids along a line between each two adjacent and longitudinal LED chips to form a plurality of package colloids that are separated from each other and respectively covered on the corresponding LED chips, and a top surface of each package colloid being the colloid cambered surface and each package colloid has a colloid light-emitting surface formed in front of the corresponding colloid cambered surface —S106 respectively covering and filling a frame unit on the substrate body, on the package colloids, and between each two adjacent package colloids via a second mold unit —S108 transversely cutting the frame unit and the substrate body along a line between each two adjacent and longitudinal LED chips to form a plurality of light bars, and each light bar having a frame layer for exposing the colloid light-emitting surfaces of the package colloids —S110

LED CHIP PACKAGE STRUCTURE WITH HIGH-EFFICIENCY LIGHT-EMITTING EFFECT AND METHOD OF PACKING THE SAME

BACKGROUND OF THE INVENTION

1. Field of the Invention

The present invention relates to an LED chip package structure and a method of packaging the same, and particularly relates to a light socket structure for an LED chip package structure that emits light highly efficiently and a method of packaging the same.

2. Description of the Related Art

Figure 1:
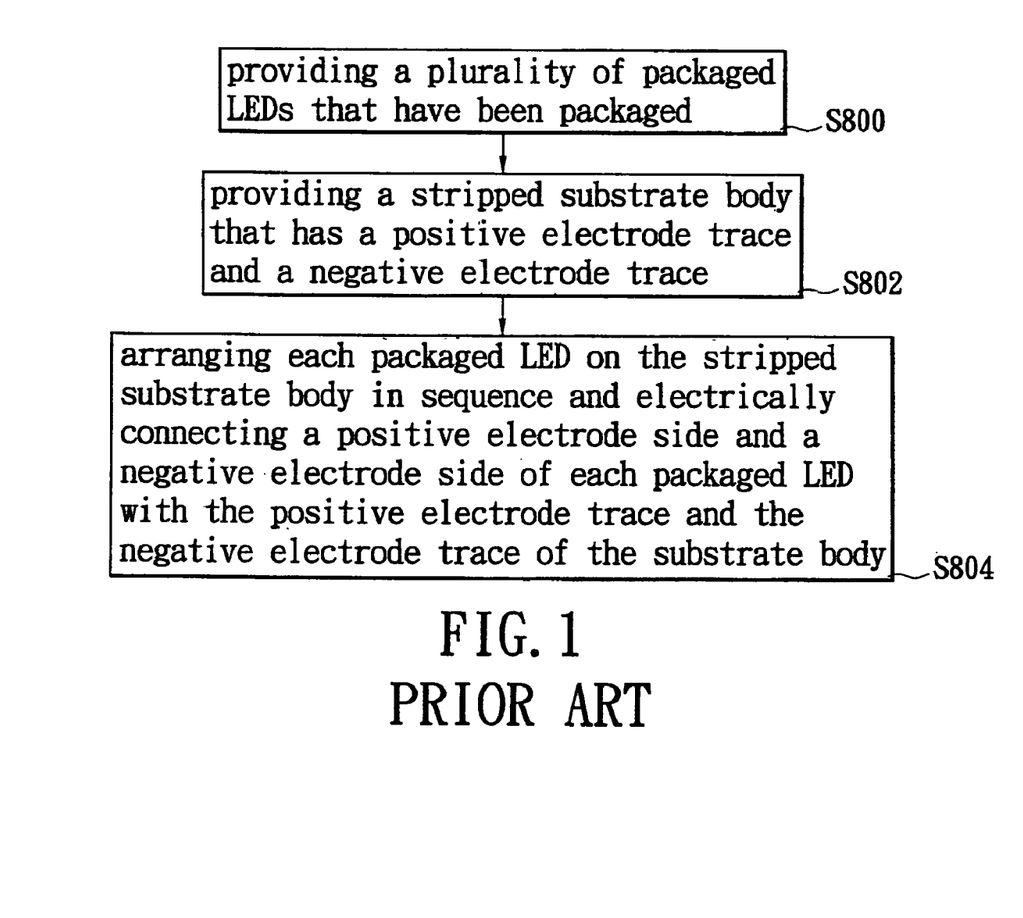
FIG. 1 is a flowchart of a first method for packaging LED chips of the prior art.

Referring to FIG. 1, a known first method for packaging LED chips is shown. The known first method includes: providing a plurality of packaged LEDs that have been packaged (S800); providing a stripped substrate body that has a positive electrode trace and a negative electrode trace (S802); and then, arranging each packaged LED on the stripped substrate body in sequence and electrically connecting a positive electrode side and a negative electrode side of each packaged LED with the positive electrode trace and the negative electrode trace of the substrate body (S804).

Figure 2:
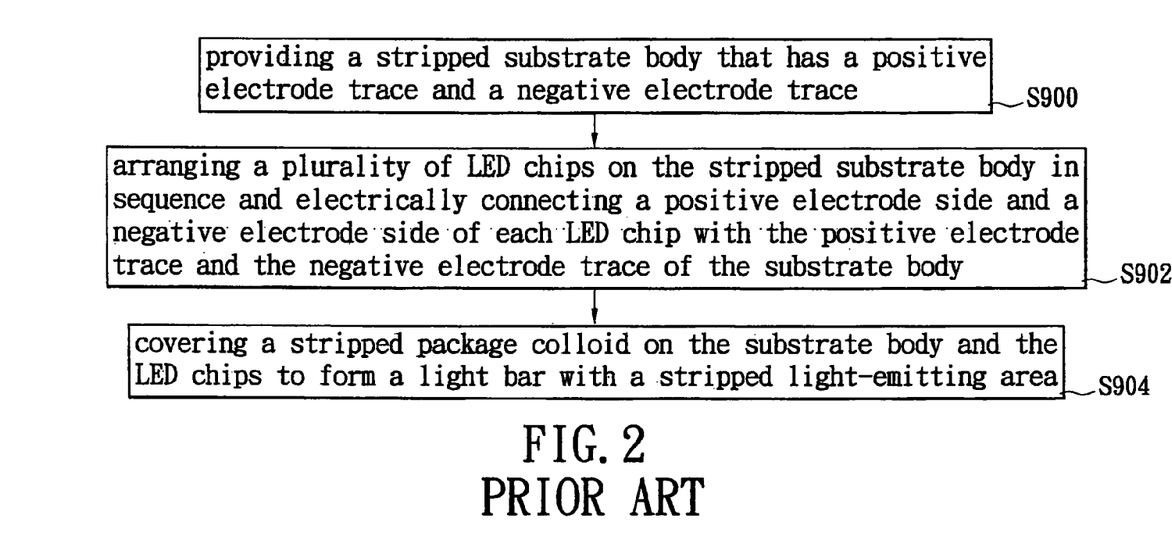
FIG. 2 is a flowchart of a second method for packaging LED chips of the prior art.

Referring to FIG. 2, a known second method for packaging LED chips is shown. The known second method includes: providing a stripped substrate body that has a positive electrode trace and a negative electrode trace (S900); arranging a plurality of LED chips on the stripped substrate body in sequence and electrically connecting a positive electrode side and a negative electrode side of each LED chip with the positive electrode trace and the negative electrode trace of the substrate body (S902); and then, covering a stripped package colloid on the substrate body and the LED chips to form a light bar with a stripped light-emitting area (S904).

However, with regard to the known first method, each packaged LED needs to be firstly cut from an entire LED package structure, and then each packaged LED is arranged on the stripped substrate body via SMT process. Hence, the known first packaging process is time-consuming. Moreover, because the fluorescent colloids 4a are separated from each other, a dark band is easily produced between the two fluorescent colloids 4a and the two LEDs 2a. Hence, the known LED package structure does not offer a good display for users. Moreover, because the package colloids of the packaged LEDs are separated from each other, a dark band is easily produced between each two package colloids and each two packaged LEDs. Hence, the known first LED package structure does not offer a good display for users.

With regard to the known second method, because the light bar produces the stripped light-emitting area, no dark band is produced. However, the triggered area of the stripped package colloid is not uniform, so the light-emitting efficiency of the light bar is not good. In other words, one partial package area of the stripped package colloid close to the LED chips generates a stronger triggered light, and the other partial package area of the stripped package colloid separated from the LED chips generates a weaker triggered light.

Figure 3:
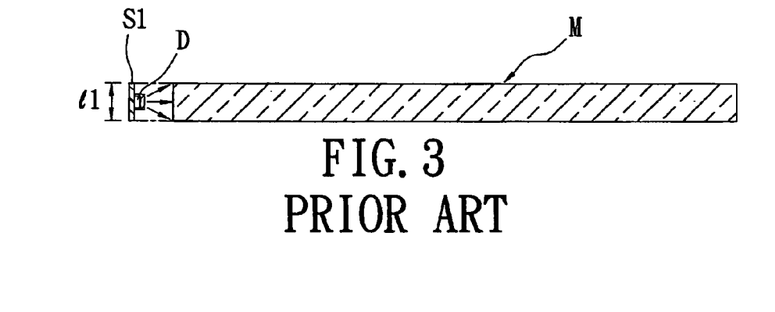
FIG. 3 is a schematic view of an LED chip package structure used to generate lateral projected light according to the prior art.

Referring to FIG. 3, an LED chip D is used to generate lateral projected light as a lateral light source that is applied to a light-guiding board M of a monitor of a notebook. Because the light-guiding board M of the monitor is very thin, a length 11 of a base S1 needs to be shortened. In other words, the length 11 of the base S1 is very short, the LED chip D can not get good heat-dissipating effect (the length 11 of the base S1 is limited by the thickness of light-guiding board M). Hence, the LED chip D is damaged easily due to overheat.

SUMMARY OF THE INVENTION

The present invention provides an LED chip package structure and a method of packaging the same. When the LED chip package structure of the present invention lights up, the LED chip package structure generates a series of light-generating areas on a colloid unit. Because the series of light-generating areas is continuous, no dark bands are produced between each two LED chips and no light decay in the present invention. Furthermore, because the LED chips are arranged on a substrate body via an adhesive or a hot pressing method, the process for the LED chip package structure is simple and less time is needed for the manufacturing process. Furthermore, the LED chip package structure can be applied to any type of light source such as a back light module, a decorative lamp, a lighting lamp, or a scanner.

Moreover, the LED chip package structure of the present can be used in vertical state due to the special hot pressing method. Hence, the LED chip package structure of the present invention not only has a good heat-dissipating effect, but also can be applied to a thin casing.

A first aspect of the present invention is a method of packaging LED chips with high-efficiency light-emitting effect. The method includes:

providing a substrate unit, wherein the substrate unit has a substrate body, and a positive electrode trace and a negative electrode trace respectively formed on the substrate body;

arranging a plurality of LED chips on the substrate body via a matrix method to form a plurality of longitudinal LED chip rows, wherein each LED chip has a positive electrode side and a negative electrode side respectively and electrically connected with the positive electrode trace and the negative electrode trace of the substrate unit; and longitudinally and respectively covering a plurality of stripped package colloids on the longitudinal LED chip rows via a first mold unit, wherein each stripped package colloid has a plurality of colloid cambered surfaces that form on a top surface thereof and correspond to the LED chips.

Moreover, the method further comprise three packaging processes, which can be described as follows:

The first packaging process includes: transversely cutting the stripped package colloids along a line between each two adjacent and longitudinal LED chips to form a plurality of package colloids that are separated from each other and respectively covered on the corresponding LED chips, wherein each package colloid has a colloid cambered surface formed on a top surface thereof and a colloid light-emitting surface formed in front of the corresponding colloid cambered surface; respectively covering and filling a frame unit on the substrate body, on the package colloids, and between each two adjacent package colloids via a second mold unit; and transversely cutting the frame unit and the substrate body along a line between each two adjacent and longitudinal LED chips to form a plurality of light bars, wherein each light bar has a frame layer for exposing the colloid light-emitting surfaces of the package colloids.

The second packaging process includes: transversely cutting the stripped package colloids along a line between each two adjacent and longitudinal LED chips to form a plurality of package colloids that are separated from each other and respectively covered on the corresponding LED chips, wherein each package colloid has a colloid cambered surface formed on a top surface thereof and a colloid light-emitting surface formed in front of the corresponding colloid cambered surface; respectively covering and filling a plurality of stripped frame layers on the substrate body, on the package colloids, and between each two longitudinal and adjacent package colloids via a third mold unit; and transversely cutting the stripped frame layers and the substrate body along a line between each two adjacent and longitudinal LED chips to form a plurality of light bars, wherein each light bar has a plurality of frame bodies for respectively exposing the colloid light-emitting surfaces of the package colloids.

A second aspect of the present invention is an LED chip package structure with high-efficiency light-emitting effect. The LED chip package structure includes a substrate unit, a light-emitting unit, and a package colloid unit.

The substrate unit has a substrate body, and a positive electrode trace and a negative electrode trace respectively formed on the substrate body. The light-emitting unit has a plurality of LED chips arranged on the substrate body. Each LED chip has a positive electrode side and a negative electrode side respectively and electrically connected with the positive electrode trace and the negative electrode trace of the substrate unit. The package colloid unit has a plurality of package colloids respectively covered on the LED chips. Each package colloid has a colloid cambered surface and a colloid light-emitting surface respectively formed on a top surface and a front surface thereof.

Moreover, the LED chip package structure further comprises two detailed structures, as follows:

The first detailed structure includes: a frame unit that is a frame layer covered on the substrate body and disposed around whole lateral sides of each package colloid for exposing the colloid light-emitting surfaces of the package colloids.

The second detailed structure includes: a frame unit has a plurality of frame bodies, wherein each frame body is covered on the package colloid for exposing the light-emitting surface of each corresponding package colloid, and the frame bodies are separated from each other.

Therefore, because the series of light-generating areas is continuous, no dark bands are produced between each two LED chips and no light decay in the present invention. Furthermore, because the LED chips are arranged on a substrate body via an adhesive or a hot pressing method, the process for the LED chip package structure is simple and less time is needed for the manufacturing process. Moreover, the LED chip package structure of the present can be used in vertical state due to the special hot pressing method. Hence, the LED chip package structure of the present invention not only has a good heat-dissipating effect, but also can be applied to a thin casing.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which:

FIGS. 4A to 4F are cross-sectional diagrams of a packaging process according to the first embodiment of present invention;

FIGS. 7A to 7B are cross-sectional diagrams of a packaging process according to the second embodiment of present invention;

FIG. 8A is a cross-sectional diagrams of a packaging process according to the third embodiment of present invention.

DETAILED DESCRIPTION OF PREFERRED BEST MOLDS

Referring to FIGS. 4, 4a to 4f, and 3A to 3F, the first embodiment of the present invention provides a method of packaging LED chips package structure with high-efficiency light-emitting effect. The method comprises: referring to FIGS. 4a and 4A, providing a substrate unit 1, the substrate unit having a substrate body 10, and a positive electrode trace 11 and a negative electrode trace 12 respectively formed on the substrate body 10 (S100). The substrate unit 1 can be a PCB (Printed Circuit Board), a flexible substrate, an aluminum substrate, a ceramic substrate, or a copper substrate. In addition, both the positive electrode trace 11 and the negative electrode trace 12 can be aluminum circuits or silver circuits. The layouts of the positive electrode trace 11 and the negative electrode trace 12 are determined by different needs.

Figure 4:
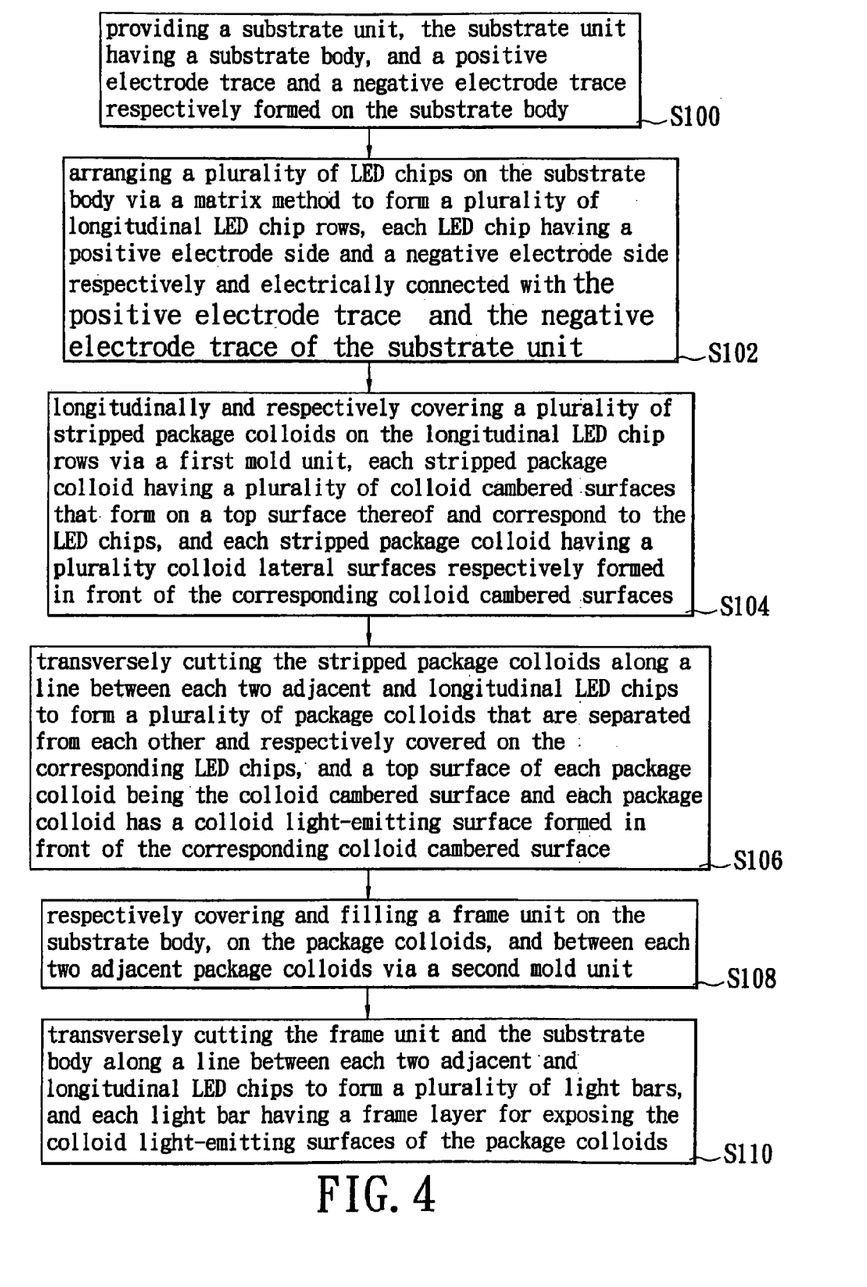
FIG. 4 is a flowchart of a method of packaging LED chips package structure according to the first embodiment of present invention.
Figure 4A:
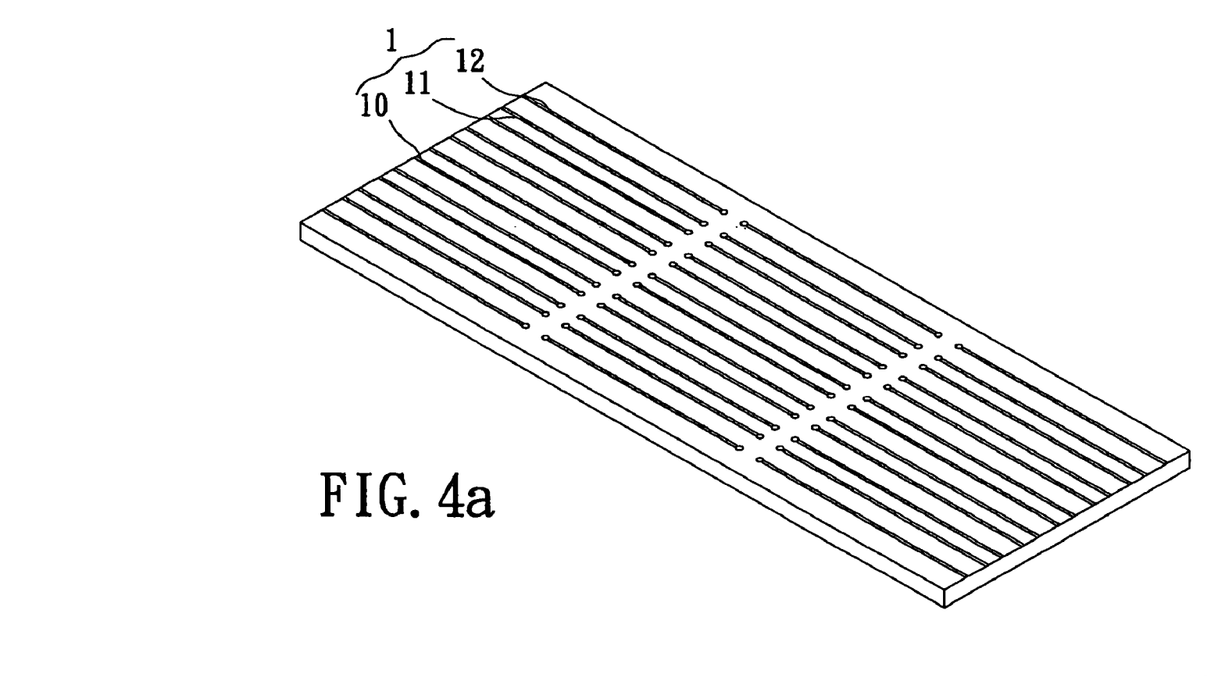
FIGS. 4a to 4f are perspective, schematic diagrams of a packaging process according to the first embodiment of present invention.
Figure 4B:
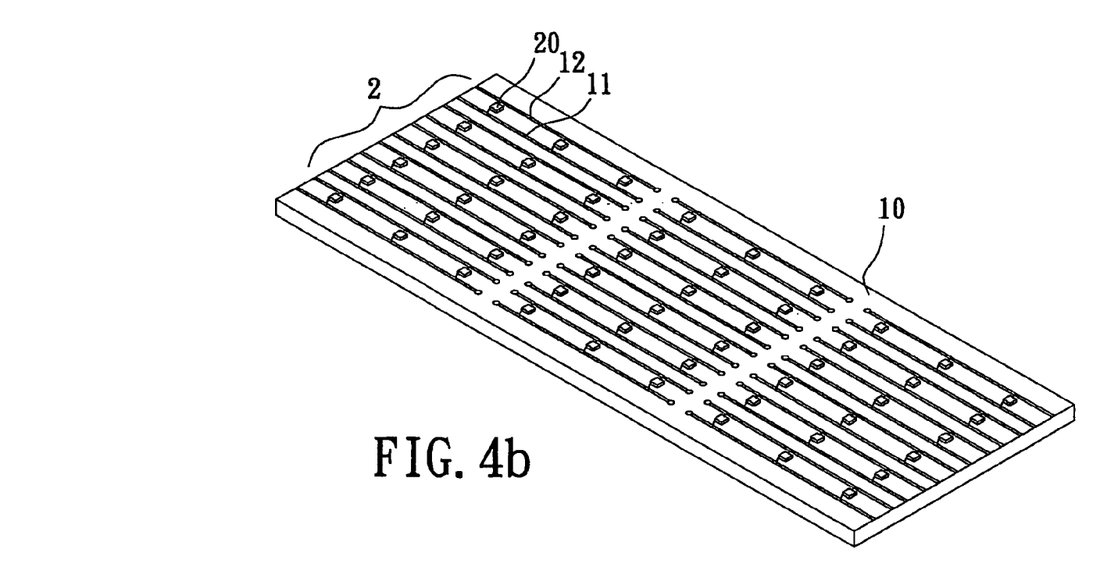

Referring to FIGS. 4b and 4B, the method of the first embodiment further comprises: arranging a plurality of LED chips 20 on the substrate body 10 via a matrix method to form a plurality of longitudinal LED chip rows 2, each LED chip 20 having a positive electrode side 201 and a negative electrode side 202 respectively and electrically connected with the positive electrode trace 11 and the negative electrode trace 12 of the substrate unit 1 (S102).

In the first embodiment, the positive electrode side 201 and the negative electrode side 202 of each LED chip 20 are respectively and electrically connected with the positive electrode trace 11 and the negative electrode trace 12 of the substrate unit 1 via two corresponding leading wires W via a wire-bounding method. Moreover, each longitudinal LED chip row 2 is straightly arranged on the substrate body 10 of the substrate unit 1. Each LED chip 20 can be a blue LED chip.

Figure 5:
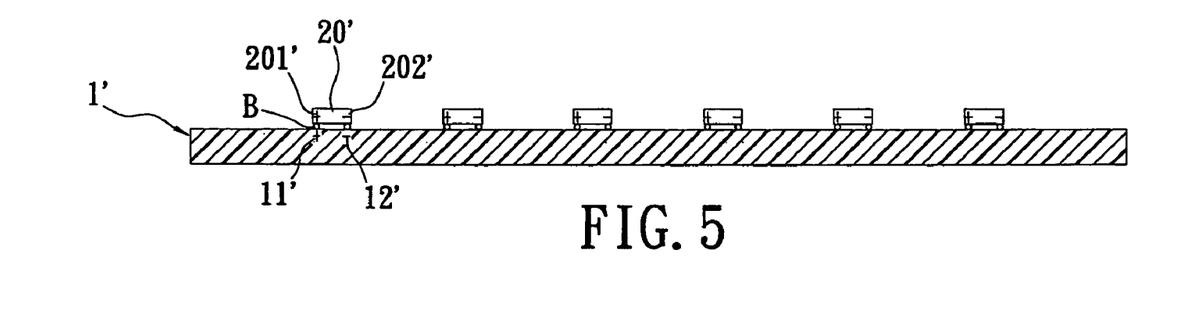
FIG. 5 is a schematic view of LED chips electrically connected on a substrate body via a flip-chip method.

However, the above-mentioned method of electrically connecting the LED chips should not be used to limit the present invention. For example, referring to FIG. 5, the positive electrode side 201' and the negative electrode side 202' of each LED chip 20' respectively and electrically connected with the positive electrode trace 11' and the negative electrode trace 12' of the substrate unit 1' via a plurality of corresponding solder balls B via a flip-chip method. Moreover, according to different needs, positive electrode sides and negative electrode sides of LED chips (not shown) can be electrically connected to a positive electrode trace and a negative electrode trace of a substrate unit (not shown) via parallel, serial, or parallel and serial method.

Figure 4C:
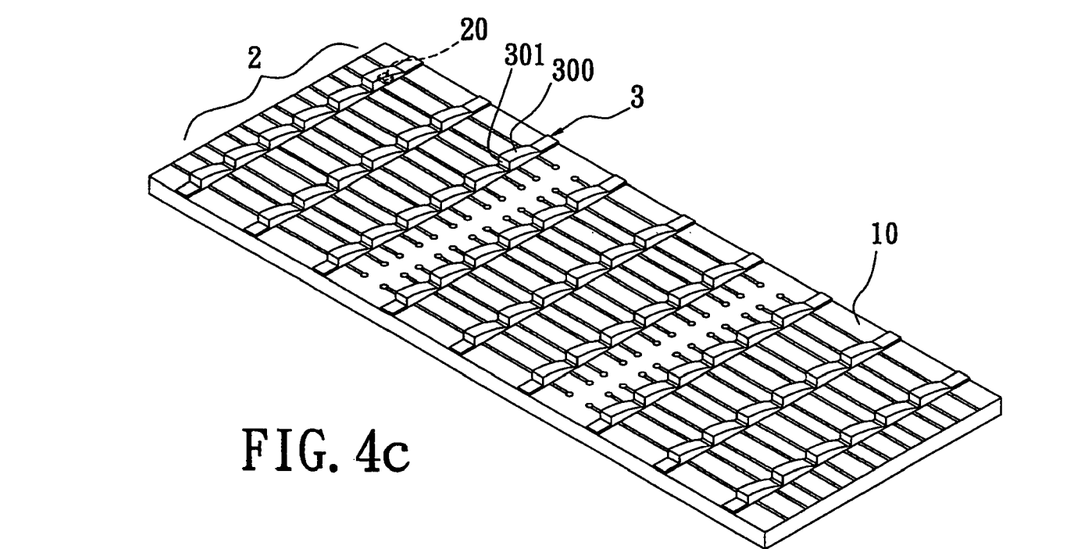
Figure 6:
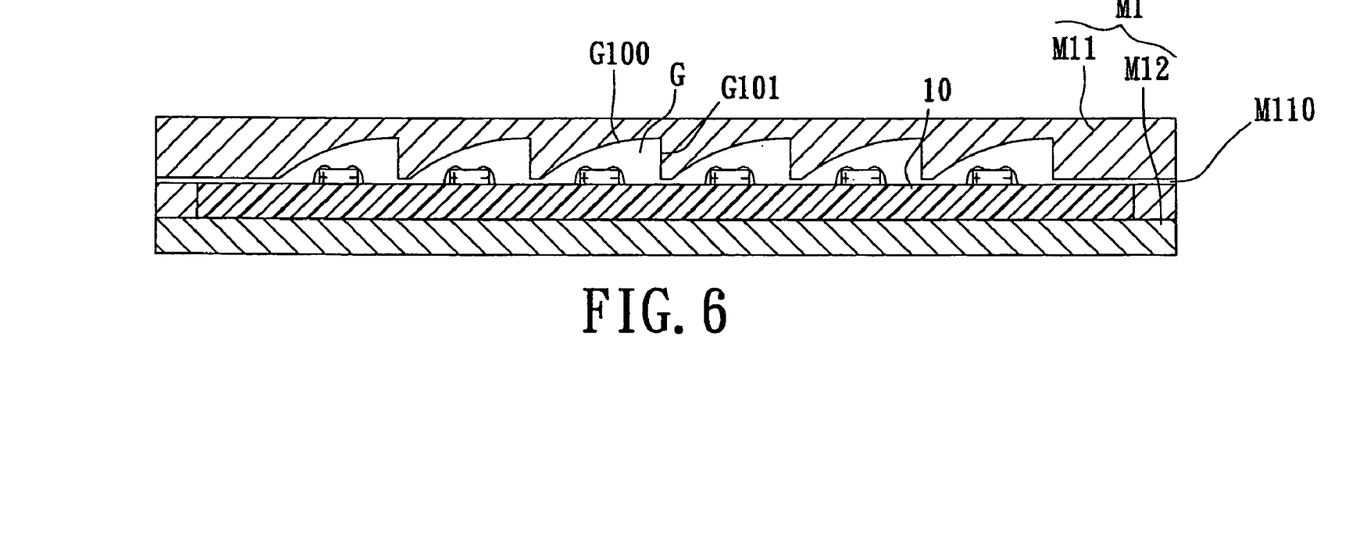
FIG. 6 is a schematic view of FIG. 4C without package colloid.

Referring to FIGS. 4c, 4C and 6, the method of the first embodiment further comprises: longitudinally and respectively covering a plurality of stripped package colloids 3 on the longitudinal LED chip rows 2 via a first mold unit M1, each stripped package colloid 3 having a plurality of colloid cambered surfaces 300 that form on a top surface thereof and correspond to the LED chips 20, and each stripped package colloid 3 having a plurality colloid lateral surfaces 301 respectively formed in front of the corresponding colloid cambered surfaces 300 (S104).

The first mold unit M1 is composed of a first upper mold M11 and a first lower mold M12 for supporting the substrate body 10. The first upper mold M11 has a plurality of first channels M10 corresponding to the longitudinal LED chip rows 2. Each first channel M110 has a plurality of concave grooves G. Each concave groove G has a mold cambered surface G100 and a mold lateral surface G101 respectively formed on a top surface and a front surface thereof. The mold cambered surface G100 corresponds to the corresponding colloid cambered surface 300 and the mold lateral surface G101 corresponds to the corresponding colloid lateral surface 301.

Each first channel M10 has a size is same as that of each stripped package colloid 3. Moreover, according to a user's needs, each stripped package colloid 3 can be a fluorescent resin that is formed by mixing silicon and fluorescent powders, or each stripped package colloid 3 can be a fluorescent resin that is formed by mixing epoxy and fluorescent powders.

Figure 4D:
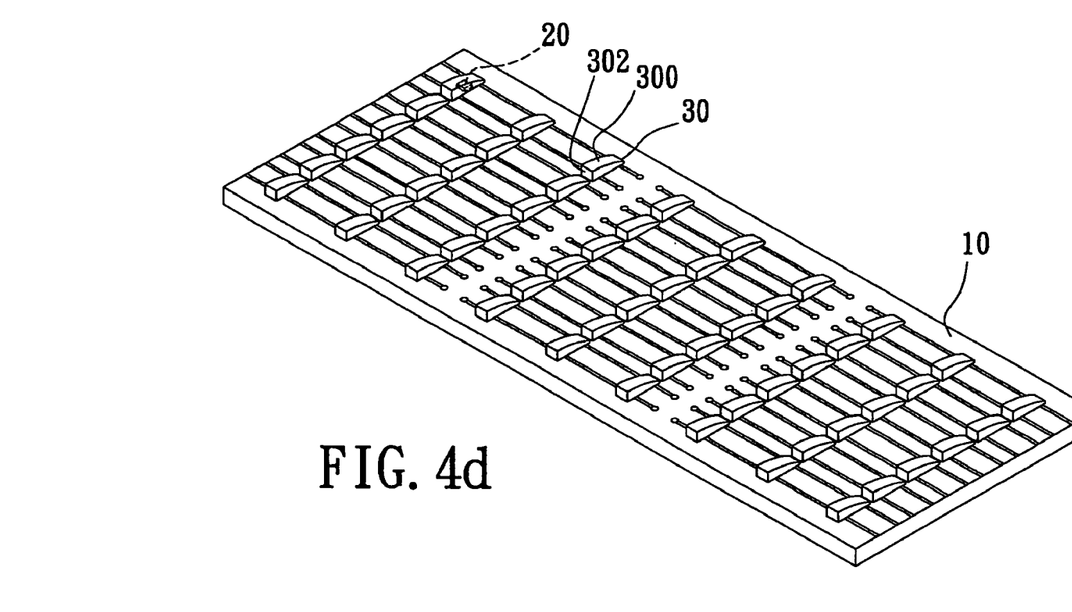

Finally, referring to FIGS. 4c, 4d, and 3D, the method of the first embodiment further comprises: transversely cutting the stripped package colloids 3 along a line between each two adjacent and longitudinal LED chips 20 to form a plurality of package colloids 30 that are separated from each other and respectively covered on the corresponding LED chips 20, and a top surface of each package colloid 30 being the colloid cambered surface 300 and each package colloid 30 has a colloid light-emitting surface 302 formed in front of the corresponding colloid cambered surface 300 (S106).

Figure 4E:
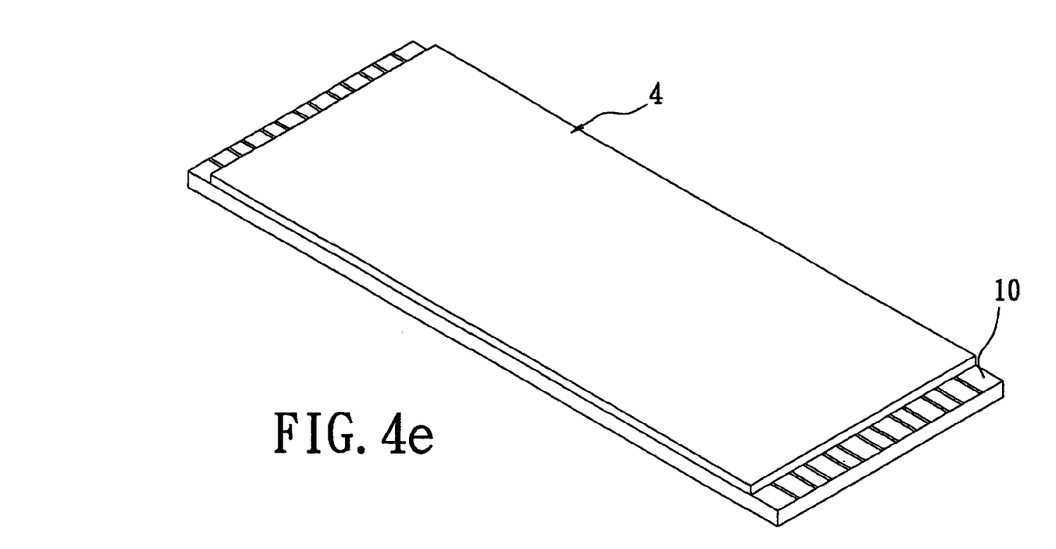

Referring to FIGS. 4e and 4E, the method of the first embodiment further comprises: respectively covering and filling a frame unit 4 on the substrate body 10, on the package colloids 30, and between each two adjacent package colloids 30 via a second mold unit M2 (S108). Moreover, the second mold unit M2 is composed of a second upper mold M21 and a second lower mold M22 for supporting the substrate body 10. The second upper mold M21 has a second channel M210 corresponding to the frame unit 4. The second channel M210 has a height the same as that of each package colloid 30 and the second channel M210 has a width the same as that of the frame unit 4.

Figure 4F:
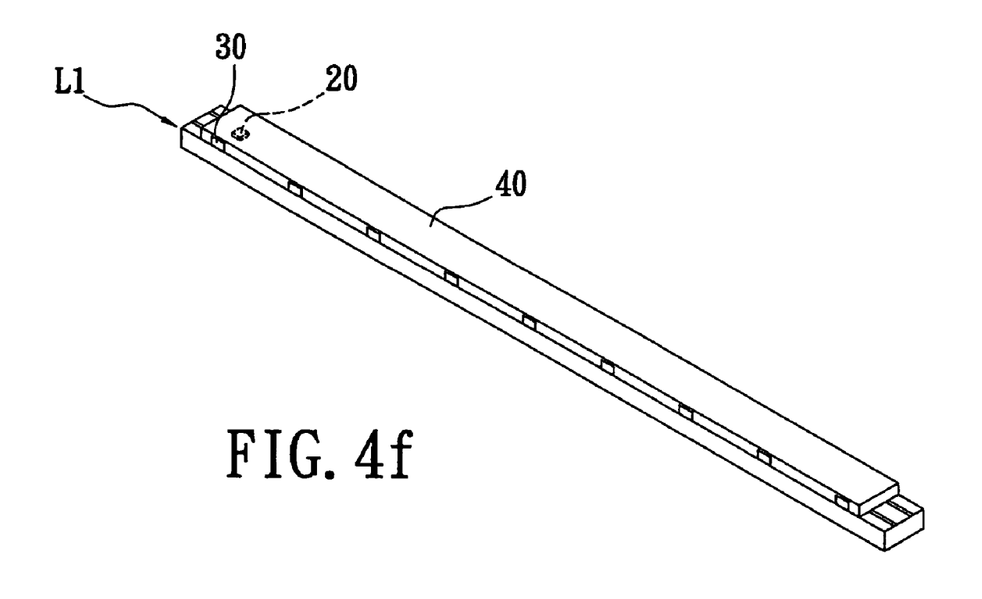

Finally, referring to FIGS. 4e, 4f, and 4F, the method of the first embodiment further comprises: transversely cutting the frame unit 4 and the substrate body 10 along a line between each two adjacent and longitudinal LED chips 20 to form a plurality of light bars L1, and each light bar L1 having a frame layer 40 for exposing the colloid light-emitting surfaces 302 of the package colloids 30 (S110). Moreover, the frame layer 40 can be an opaque frame layer such as a white frame layer.

Figure 7:
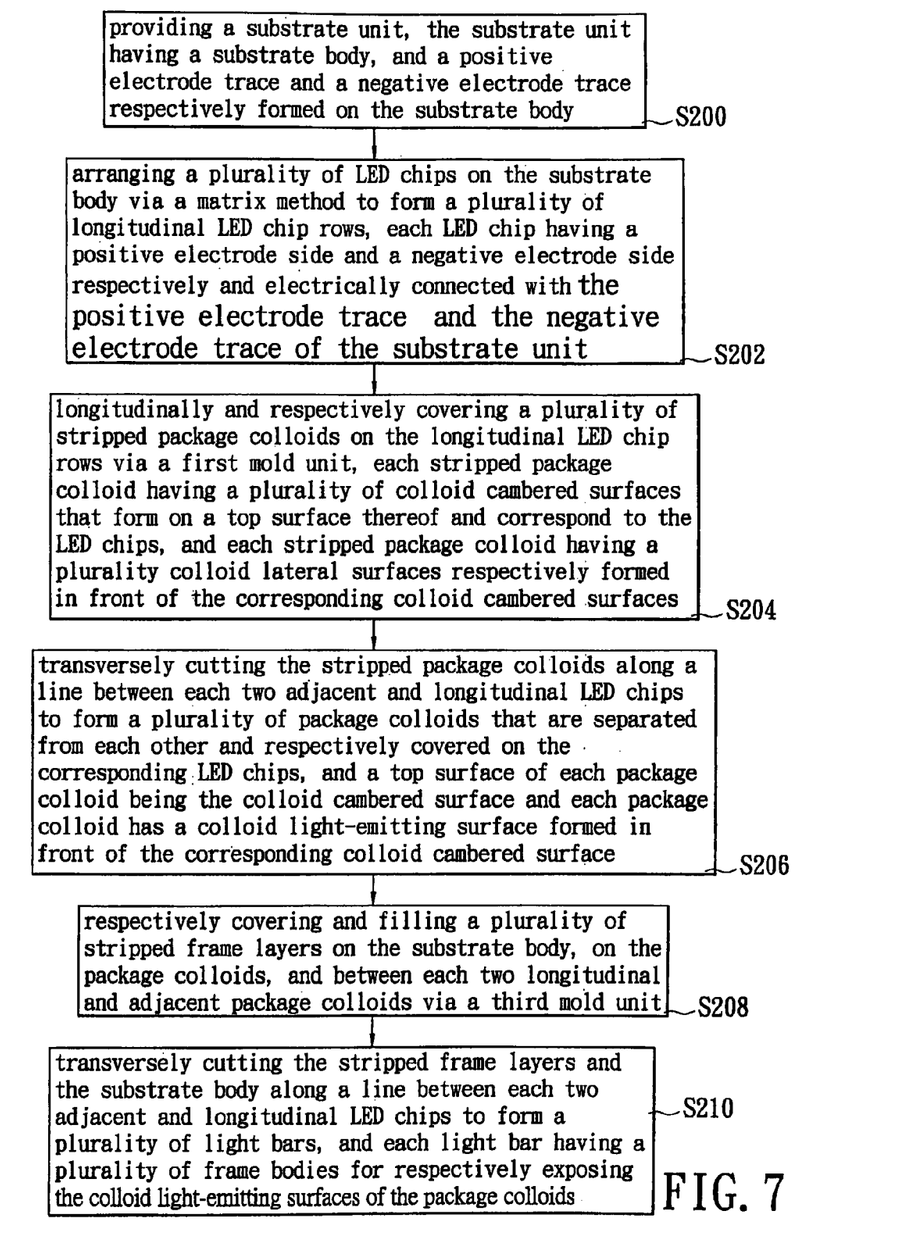
FIG. 7 is a flowchart of a method of packaging LED chips package structure according to the second embodiment of present invention.
Figure 7A:
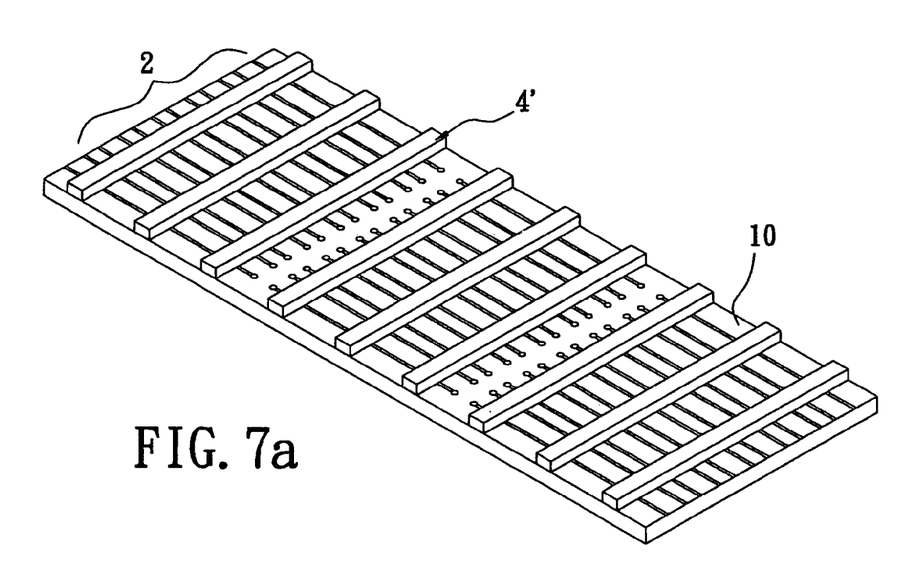
FIGS. 7a to 7b are perspective, schematic diagrams of a packaging process according to the second embodiment of present invention.
Figure 7B:
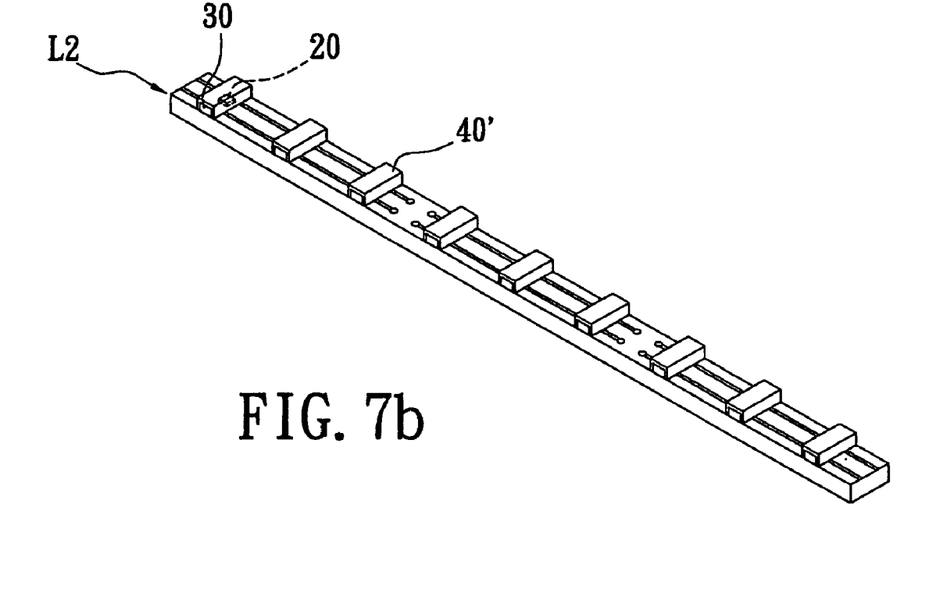

Referring to FIGS. 7, 7a to 7b, and 7A to 7B, the second embodiment of the present invention provides a method of packaging LED chips package structure with high-efficiency light-emitting effect. Referring to FIGS. 4 and 7, the steps S200 to S206 of the second embodiment are same as the steps S100 to S106 of the first embodiment. In other words, the illustration of S200 is the same as FIGS. 4a and 4A of the first embodiment, the illustration of S202 is the same as FIGS. 4b and 4B of the first embodiment, the illustration of S204 is the same as FIGS. 4c and 4C of the first embodiment, and the illustration of S206 is the same as FIGS. 4d and 4D of the first embodiment.

After the step of S206, referring to FIGS. 7a and 7A, the method of the second embodiment further comprises: respectively covering and filling a plurality of stripped frame layers 4' on the substrate body 10, on the package colloids 30, and between each two longitudinal and adjacent package colloids 30 via a third mold unit M3 (S208).

The third mold unit M3 is composed of a third upper mold M31 and a third lower mold M32 for supporting the substrate body 10. The third upper mold M31 has a plurality of third channels M310 corresponding to the longitudinal LED chip rows 2. Each third channel M310 has a height the same as that of each corresponding package colloid 30 and each third channel M310 has a width larger than that of each corresponding package colloid 30.

Finally, referring to FIGS. 7a, 7b, and 7B, the method of the second embodiment further comprises: transversely cutting the stripped frame layers 4' and the substrate body 10 along a line between each two adjacent and longitudinal LED chips 20 to form a plurality of light bars L2, and each light bar L2 having a plurality of frame bodies 40' for respectively exposing the colloid light-emitting surfaces 302 of the package colloids 30 (S210). Moreover, each frame layer 40' can be an opaque frame body such as a white frame body.

Figure 8A:
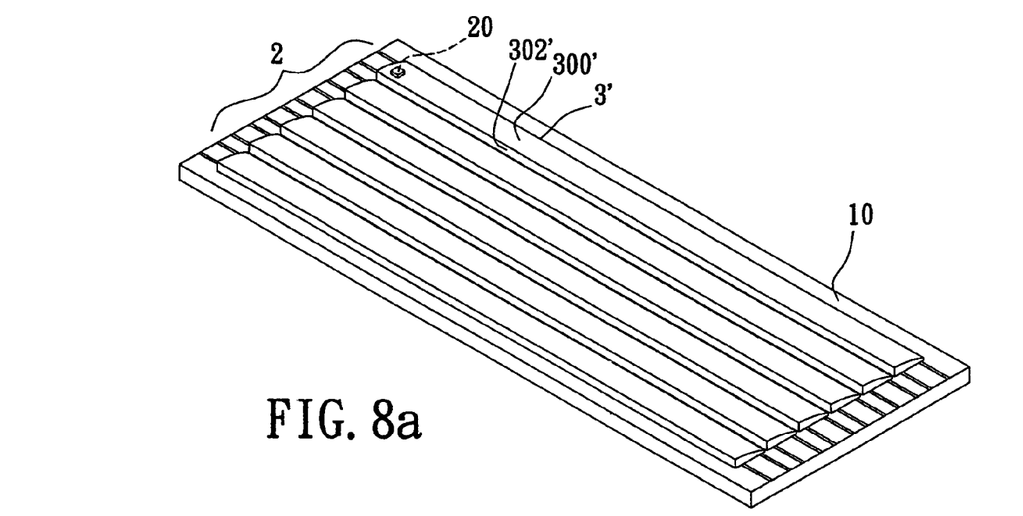
FIG. 8a is a perspective, schematic diagrams of a packaging process according to the third embodiment of present invention.

Referring to FIGS. 8a and 8A, the third embodiment of the present invention provides a method of packaging LED chips package structure with high-efficiency light-emitting effect. The difference between the third embodiment and the first embodiment (or second embodiment) is that "transversely cutting the stripped package colloids 3 along a line between each two adjacent and longitudinal LED chips 20" is changed into "longitudinally cutting the stripped package colloids 3' along a line between each two adjacent and transverse LED chips 20".

The fourth mold unit M4 is composed of a fourth upper mold M41 and a fourth lower mold M42 for supporting the substrate body 10. The difference between the fourth mold unit M4 and the first mold unit M1 is that each fourth channel M410 has a mold cambered surface 300' and a mold light-emitting surface 302' respectively formed on a top surface and a front surface thereof. Hence, the stripped package colloids 3' are transversely covered on the longitudinal LED chips 2.

Figure 9:
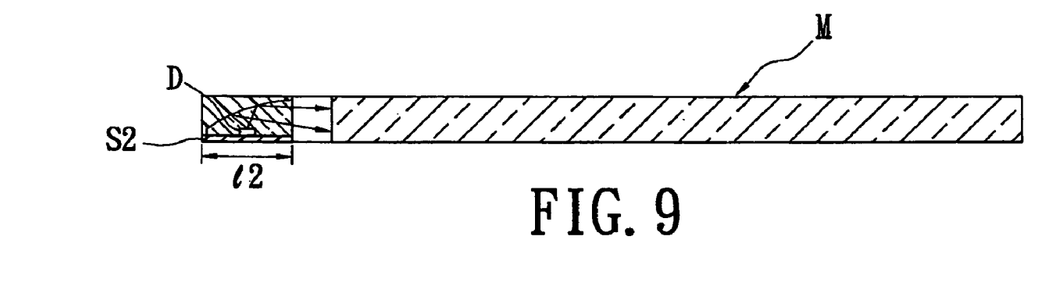
FIG. 9 is a schematic view of an LED chip package structure used to generate lateral projected light according to the present invention.

Referring to FIG. 9, when an LED chip D is used to generate lateral projected light as a lateral light source that is applied to a light-guiding board M of a monitor of a notebook, a length l2 of a base S2 can be increased according to heat-dissipation requirement (that is very different from the prior art). In other words, the length l2 of the base S2 can be increased, the LED chip D can get good heat-dissipating effect. Hence, the LED chip D can not be damaged easily due to overheat.

In conclusion, Therefore, because the series of light-generating areas is continuous, no dark bands are produced between each two LED chips and no light decay in the present invention. Furthermore, because the LED chips are arranged on a substrate body via an adhesive or a hot pressing method, the process for the LED chip package structure is simple and less time is needed for the manufacturing process. Moreover, the LED chip package structure of the present can be used in vertical state due to the special hot pressing method. Hence, the LED chip package structure of the present invention not only has a good heat-dissipating effect, but also can be applied to a thin casing.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An LED chip package structure with high-efficiency light-emitting effect, comprising:
    a substrate unit having an opaque substrate body, and a positive electrode trace and a negative electrode trace respectively formed on the opaque substrate body;
    a light-emitting unit having a plurality of LED chips arranged on the opaque substrate body, wherein each LED chip has a positive electrode side and a negative electrode side respectively and electrically connected with the positive electrode trace and the negative electrode trace of the substrate unit;
    a package colloid unit having a plurality of package colloids for respectively covering the LED chips, wherein each package colloid has a colloid cambered surface and a colloid light-emitting surface respectively formed on a top surface and a front surface thereof, and the colloid cambered surface is extended upwards and forwards from a top surface of the opaque substrate body and the colloid light-emitting surface is extended downwards from a top end of the colloid cambered surface to the top surface of the opaque substrate body; and
    a frame unit having an opaque frame layer formed on the opaque substrate body and covering the package colloids, wherein only the colloid light-emitting surface of each package colloid is exposed outside and the colloid cambered surface and other outer surfaces of each package colloid are covered by the opaque frame layer, and thus one part of light beams generated by the LED chips are directly projected outside from the colloid light-emitting surface of each package colloid and other part of light beams generated by the LED chips are reflected by an inner surface of the opaque frame layer and then projected outside from the colloid light-emitting surface of each package colloid.

2. The LED chip package structure as claimed in claim 1, wherein the substrate unit is a PCB, a flexible substrate, an aluminum substrate, a ceramic substrate, or a copper substrate.

3. The LED chip package structure as claimed in claim 1, wherein both the positive electrode trace and the negative electrode trace are aluminum circuits or silver circuits.

4. The LED chip package structure as claimed in claim 1, wherein the positive electrode side and the negative electrode side of each LED chip are respectively and electrically connected with the positive electrode trace and the negative electrode trace of the substrate unit via two corresponding leading wires via a wire-bounding method.

5. The LED chip package structure as claimed in claim 1, wherein the positive electrode side and the negative electrode side of each LED chip are respectively and electrically connected with the positive electrode trace and the negative electrode trace of the substrate unit via a plurality of corresponding solder balls via a flip-chip method.

6. The LED chip package structure as claimed in claim 1, wherein each longitudinal LED chip row is straightly arranged on the opaque substrate body of the substrate unit.

7. The LED chip package structure as claimed in claim 1, wherein the LED chips are straightly arranged on the opaque substrate body of the substrate unit along a plurality of straight lines.

8. The LED chip package structure as claimed in claim 1, wherein each package colloid is a fluorescent resin that is formed by mixing silicon and fluorescent powders.

9. The LED chip package structure as claimed in claim 1, wherein each package colloid is a fluorescent resin that is formed by mixing epoxy and fluorescent powders.

10. The LED chip package structure as claimed in claim 1, wherein the opaque frame layer is a white frame layer.

11. An LED chip package structure with high-efficiency light-emitting effect, comprising:
    a substrate unit having an opaque substrate body, and a positive electrode trace and a negative electrode trace respectively formed on the opaque substrate body;
    a light-emitting unit having a plurality of LED chips arranged on the opaque substrate body, wherein each LED chip has a positive electrode side and a negative electrode side respectively and electrically connected with the positive electrode trace and the negative electrode trace of the substrate unit;
    a package colloid unit having a plurality of package colloids for respectively covering the LED chips, wherein each package colloid has a colloid cambered surface and a colloid light-emitting surface respectively formed on a top surface and a front surface thereof, and the colloid cambered surface is extended upwards and forwards from a top surface of the opaque substrate body and the colloid light-emitting surface is extended downwards from a top end of the colloid cambered surface to the top surface of the opaque substrate body; and
    a frame unit having a plurality of opaque frame bodies formed on the opaque substrate body and respectively covering the package colloids, and the opaque frame bodies being separated from each other, wherein only the colloid light-emitting surface of each package colloid is exposed outside and the colloid cambered surface and other outer surfaces of each package colloid are covered by each opaque frame body, and thus one part of light beams generated by the LED chips are directly projected outside from the colloid light-emitting surfaces of the package colloids and other part of light beams generated by the LED chips are reflected by inner surfaces of the opaque frame bodies and then projected outside from the colloid light-emitting surfaces of the package colloids.

* * * * *